(12) United States Patent
Vadakkanmaruveedu et al.

(10) Patent No.: US 8,623,705 B2
(45) Date of Patent: Jan. 7, 2014

(54) NANOTUBE BASED VAPOR CHAMBER FOR DIE LEVEL COOLING

(75) Inventors: Unnikrishnan Vadakkanmaruveedu, Hillsboro, OR (US); Gregory Martin Chrysler, Sun Lakes, AZ (US); James G. Maveety, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/045,503

(22) Filed: Mar. 10, 2011

(65) Prior Publication Data

US 2011/0269271 A1    Nov. 3, 2011

Related U.S. Application Data

(62) Division of application No. 11/865,067, filed on Sep. 30, 2007, now Pat. No. 7,911,052.

(51) Int. Cl.
*H01L 21/00* (2006.01)

(52) U.S. Cl.
USPC ............... 438/122; 257/E23.08; 257/715

(58) Field of Classification Search
USPC ............. 438/122; 257/712–717, E23.08, 257/E23.097, E23.098
See application file for complete search history.

(56) References Cited

U.S. PATENT DOCUMENTS

| 5,095,404 | A | 3/1992 | Chao |
| 6,887,395 | B2 | 5/2005 | Hareland et al. |
| 6,988,531 | B2 | 1/2006 | Chrysler et al. |
| 7,250,366 | B2 | 7/2007 | Dubin |
| 7,335,983 | B2 | 2/2008 | Maveety et al. |
| 7,365,003 | B2 | 4/2008 | Ravi et al. |
| 7,428,138 | B2 | 9/2008 | Mosley et al. |
| 7,514,116 | B2 | 4/2009 | Natekar et al. |
| 7,545,030 | B2 | 6/2009 | Chrysler et al. |
| 7,911,052 | B2 | 3/2011 | Vadakkanmaruveedu et al. |
| 2005/0022976 | A1* | 2/2005 | Rosenfeld et al. ........ 165/104.11 |
| 2005/0276743 | A1* | 12/2005 | Lacombe et al. ........... 423/447.3 |
| 2006/0180859 | A1 | 8/2006 | Radosavljevic et al. |
| 2006/0223243 | A1 | 10/2006 | Radosavljevic et al. |
| 2007/0001310 | A1 | 1/2007 | Hua et al. |
| 2007/0284089 | A1 | 12/2007 | Vadakkanmaruveedu et al. |
| 2008/0053640 | A1* | 3/2008 | Mok ......................... 165/104.33 |
| 2008/0128116 | A1* | 6/2008 | Dangelo et al. ........... 165/104.21 |
| 2008/0239620 | A1 | 10/2008 | Min et al. |

FOREIGN PATENT DOCUMENTS

JP          2004284938 A    * 10/2004   ............. C01B 31/02

* cited by examiner

*Primary Examiner* — Yu-Hsi D Sun
(74) *Attorney, Agent, or Firm* — Konrad Raynes Davda & Victor LLP; Alan S. Raynes

(57) ABSTRACT

The formation of electronic assemblies is described. In one embodiment, an electronic assembly includes a semiconductor die and a plurality of spaced apart nanotube structures on the semiconductor die. The electronic assembly also includes a fluid positioned between the spaced apart nanotube structures on the semiconductor die. The electronic assembly also includes a endcap covering the plurality of nanotube structures and the fluid, wherein the endcap is positioned to define a gap between the nanotube structures and an interior surface of the endcap. The endcap is also positioned to form a closed chamber including the working fluid, the nanotube structures, and the gap between the nanotube structures and the interior surface of the endcap.

14 Claims, 4 Drawing Sheets

Fig. 1
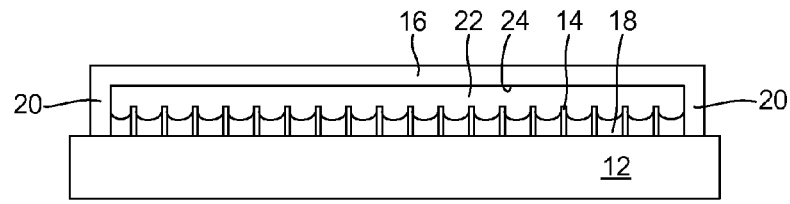
Fig. 2
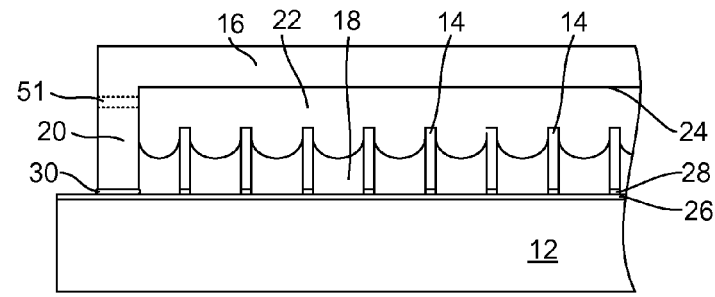
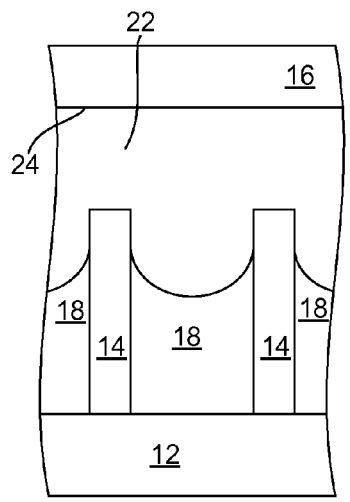
Fig. 3(A)
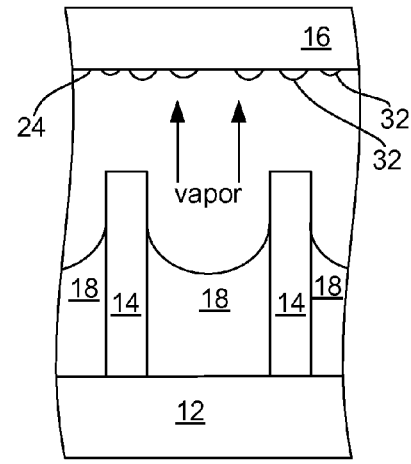
Fig. 3(B)

NANOTUBE BASED VAPOR CHAMBER FOR DIE LEVEL COOLING

This application is a divisional of U.S. patent application Ser. No. 11/865,067 filed Sep. 30, 2007 now U.S. Pat. No. 7,911,052, which is hereby incorporated by reference in its entirety.

RELATED ART

Integrated circuits may be formed on semiconductor wafers that are formed from materials such as silicon. The semiconductor wafers are processed to form various electronic devices thereon. At some point during the processing, the wafers may be diced into semiconductor chips (a chip is also known as a die), and attached to a substrate using a variety of known methods.

Operation of the integrated circuit generates heat in the device. As the internal circuitry operates at increased clock frequencies and/or higher power levels, the amount of heat generated may rise to levels that are unacceptable unless some of the heat can be removed from the device. Heat is conducted to a surface of the die, and should be conducted or convected away to maintain the temperature of the integrated circuit below a predetermined level for purposes of maintaining functional integrity of the integrated circuit.

One way to conduct heat from an integrated circuit die is through the use of a heat spreader, which may in certain configurations include a plate-shaped body thermally coupled to the die through a thermal interface material. Materials such as metals (for example, copper) may be used to form heat spreaders. Materials such as, for example, solders, may be used as thermal interface materials to couple the heat spreader to the die and transmit heat from the die to the heat spreader. The heat spreading performances of these devices are limited by the relatively poor thermal conductivity of the thermal interface materials and the solid plate of copper.

BRIEF DESCRIPTION OF THE DRAWINGS

Embodiments are described by way of example, with reference to the accompanying drawings, which are not drawn to scale, wherein:

FIG. 1 illustrates an electronic assembly including a heat spreading device formed on a die, in accordance with certain embodiments;

FIG. 2 illustrates a portion of an electronic assembly including a heat spreading device formed on a die, in accordance with certain embodiments;

FIGS. 3(A)-3(F) illustrate a portion of an electronic assembly in accordance with certain embodiments, with FIG. 3(A) showing a heat spreading device including a plurality of carbon nanotube structures on a die, with a fluid positioned between the carbon nanotube structures; FIG. 3(B) showing the formation of a vapor of the fluid upon heating from the die and the formation of drops of the fluid condensing on a cooler surface positioned above the carbon nanotube structures; FIGS. 3(C)-3(D) showing the drops getting larger and coalescing, as more of the fluid is vaporized by the heat from the die; FIG. 3(E) showing the coalesced drop contacting a carbon nanotube structure and being drawn down the structure towards the die; and FIG. 3(F) showing the portion of the electronic assembly after the fluid from the coalesced drop has been drawn down the carbon nanotube structure towards the die;

DETAILED DESCRIPTION

Figure 3C:
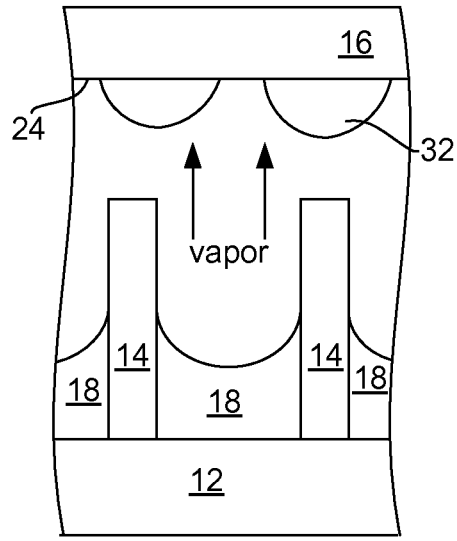

Certain embodiments relate to electronic assemblies including a heat spreading device on a die and include devices and methods related thereto.

FIG. 1 illustrates an embodiment of an electronic assembly including a plurality of nanotube structures such as carbon nanotube (CNT) structures 14 formed on a body such as, for example, a semiconductor die 12. Nanotube structures are small filaments that typically have a diameter on the order of about 10 nm and a length of up to hundreds of μm. While carbon nanotube structures are described in connection with certain figures, nanotube structures formed from other materials may also be used in various embodiments. A working fluid 18 is positioned on the die 12 between the carbon nanotube structures 14. An endcap 16 is positioned over the carbon nanotube structures and the working fluid 18 and may be coupled to the die through sidewalls 20. It should be appreciated that where terms such as over, above below, top, bottom, and the like are used herein, such terms are used in reference to the views illustrated in the Figures and not in a limiting sense.

As seen in FIG. 1, a gap or open region 22 remains between the endcap 16 and the tops of the carbon nanotube structures 14. The sidewalls 20 of the endcap 16 are coupled to the die 12 for form a tight fit that ensures that the interior portions of the assembly housing the carbon nanotube structures 14 and the working fluid 18 are sealed off and closed to the external atmosphere. The resultant structure forms a vapor chamber in which a cooling cycle may take place during operation of the die 12. When a portion of the die 12 reaches a sufficient temperature, at least a portion of the working fluid 18 positioned on the die 12 and between the carbon nanotube structures 14 will vaporize. At least some of the vapor will condense on the interior surface 24 of the endcap 16 and accumulate thereon, until one or more drops that are large enough will drip off of the interior surface 24 and/or contact one or more of the carbon nanotube structures 14 and be delivered back towards the die 12.

The working fluid 14 may be selected from a variety of materials, including, but not limited to, water, ethanol, perfluorocarbons, and hydrofluoroethers (HFE's). An example of a suitable perfluorocarbon fluid is FC-72, which is perfluorohexane ($C_6F_{14}$). Perfluorocarbons are available as Fluorinert™ Electronic Liquids from 3M™ Corporation. Hydrofluorethers are available as Novec™ Engineered Fluids from 3M™ Corporation. In certain embodiments, it may be advantageous for the working fluid to wet the carbon nanotube structures 12.

FIG. 2 illustrates a portion of an embodiment of an electronic assembly similar to that illustrated in FIG. 1, including several additional layers that may be included in the assembly. Between the semiconductor die 12 and the carbon nanotube structures 14, an insulating layer 26 such as an oxide layer (for example, silicon oxide, aluminum oxide), and a catalyst layer 28 for forming the carbon nanotube structures 14, may be formed. The catalyst layer 28 is formed from a material (for example, a metal including nickel, cobalt and/or iron) that assists in the formation of the carbon nanotube structures 14. The catalyst layer 28 may be deposited in patterned manner on the insulating layer if desired, in order to control the position of the carbon nanotube structures that will be subsequently formed. The carbon nanotube structures 14 may be formed using any suitable method, for example, a CVD method in which the insulating layer 26 and the catalyst layer are formed on the die and the substrate is heated to an elevated temperature (for example, 700° C.). A gas, which may including a combination of a process gas (for example, ammonia, nitrogen, and/or hydrogen) and a carbon-containing gas (for example, ethylene, acetylene, and/or methane), is then introduced and carbon nanotube structures are grown at the catalyst sites. In certain embodiments, it may be advantageous for the carbon nanotube structures to be substantially vertically oriented with respect to the surface they are grown on.

After forming the array of the carbon nanotube structures 14, the array may be filled with a suitable quantity of the working fluid 18 under vacuum and the system sealed with the endcap 16 coupled to the die 12, to form the vapor chamber. FIG. 2 illustrates the connection of a sidewall 20 of the endcap 16 to the die 12. A sealant material 30, such as, for example, an polymer epoxy, may be formed on the insulating layer 26 on the die 12. The sealant material 30 ensures that the endcap 16 has a tight fit to maintain a closed system. The working fluid 18 may be inserted into the system and system sealed using any suitable technique. For example, after coupling the endcap 16 to the die 12, a vacuum is applied to remove any gases in the closed vapor chamber through opening 51 having a pipe therein in the sidewall 20 of the endcap 16. Then the working fluid 18 is inserted through the opening 51, and then the opening 51 is crimped shut, using a method similar to those used for conventional heat pipes and vapor chambers. In another example of a connection and filling process, the working fluid 18 may be positioned within the endcap 16 and then the endcap 16 is coupled to the die 12.

Figure 3D:
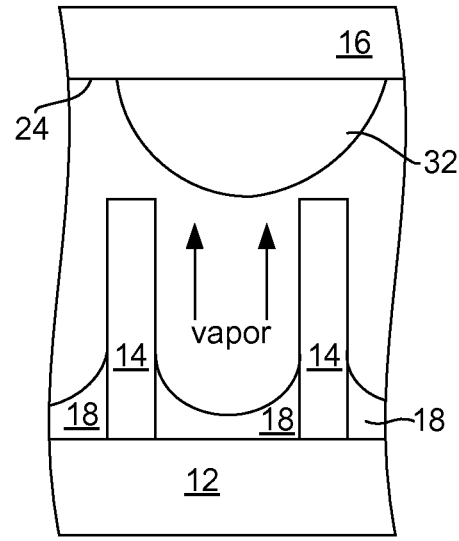

FIG. 3(A)-3(F) illustrate a portion of an electronic assembly in accordance with certain embodiments, including a detailed view over time of the cooling cycle during operation of the die 12. FIG. 3(A) illustrates two carbon nanotube structures 14 on the die 12, with a working fluid 18 positioned on the die 12 and between the carbon nanotube structures 14. FIG. 3(B) illustrates the formation of vapor, as indicated by the arrows, being generated from the working fluid due to heat from the die 12. The vapor travels into the space 22 above the carbon nanotube structures 14 and condenses on the cooler interior surface 24 of the endcap 16 as one or more drops 32. FIGS. 3(C)-3(D) illustrate the drops 32 growing larger and coalescing, as more of the working fluid 18 is vaporized by the heat from the die 12.

Figure 3E:
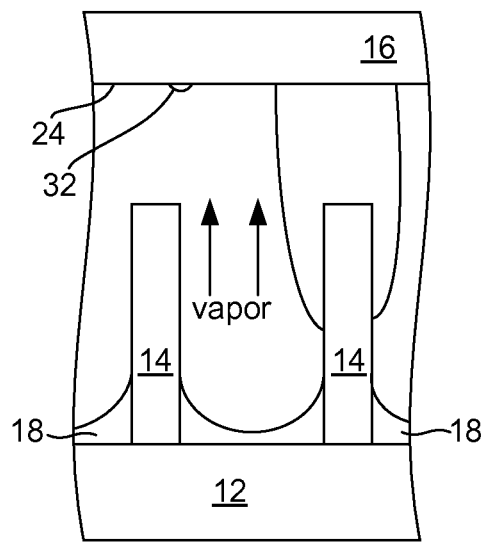
Figure 3F:
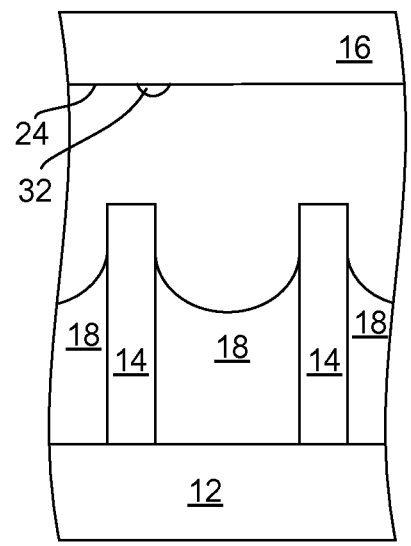

FIG. 3(E) illustrates a coalesced drop 32 contacting a carbon nanotube structure 14 and being drawn down the carbon nanotube structure 14 by capillary action. The working fluid 18 is thus delivered back towards the die 12 and, as illustrated in FIG. 3(F), the working fluid 18 is again positioned on the die 12 and between the carbon nanotube structures 14 and again ready to be vaporized. The cycle may be repeated continuously to transmit heat away from the die 12 and to the endcap 16. Other types of cooling devices such as a plate shaped heat spreader or a heat sink with fins, may be positioned on the endcap 16 if desired.

Figure 4:
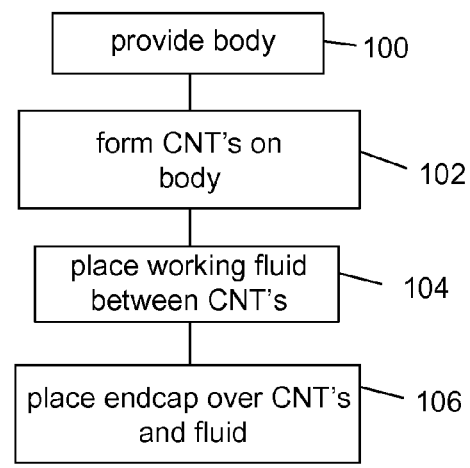
FIG. 4 illustrates a flowchart of operations for forming a heat spreading device, in accordance with certain embodiments.

FIG. 4 illustrates a flowchart of operations for forming an assembly in accordance with certain embodiments. Box 100 is providing a body. One example of such a body is a silicon die. Depending on the dimensions of the body, it may be thinned using any suitable method. Box 102 is forming carbon nanotube structures on the body. Any suitable method for forming carbon nanotube structures may be used, including, but not limited to, chemical vapor deposition (CVD) as described in connection with FIG. 2. Depending on the method used to form the carbon nanotube structures, additional layers may be formed on the body surface.

Box 104 is placing a working fluid on the body and between the carbon nanotube structures. Box 106 is placing a endcap over the carbon nanotube structures and the working fluid on the body, in a manner that leaves a gap of open space between the carbon nanotube structures and the endcap. The endcap is positioned so as to form a sealed, closed vapor chamber. Various modifications to the method described in the flowchart may be made, including, for example, the use of nanotubes that do not comprise carbon.

Figure 5:
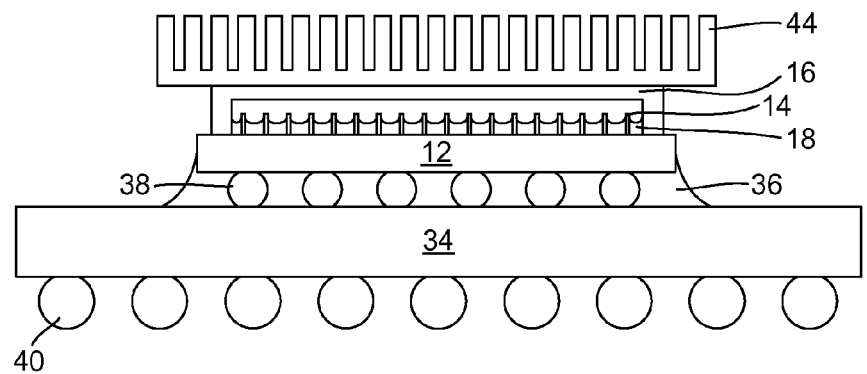
FIG. 5 illustrates an electronic assembly including a heat spreading device on a die that is coupled to a substrate, in accordance with certain embodiments.

FIG. 5 illustrates an assembly in accordance with certain embodiments, in which a vapor chamber structure including endcap 16 positioned over carbon nanotube structures 14 and working fluid 18 on die 12. The die 12 is coupled to a substrate 34 through a connection such as solder bumps 38. An underfill material 36 such as a polymer epoxy may be provided between the die 12 and the substrate 34. The substrate 34 may include connections such as solder bumps 40 for connection to another device (not shown) including, but not limited to, a board. A device such as a heat sink 44 including fins may also be provided on the endcap 16 to further transmit heat away from the die 12.

Figure 6:
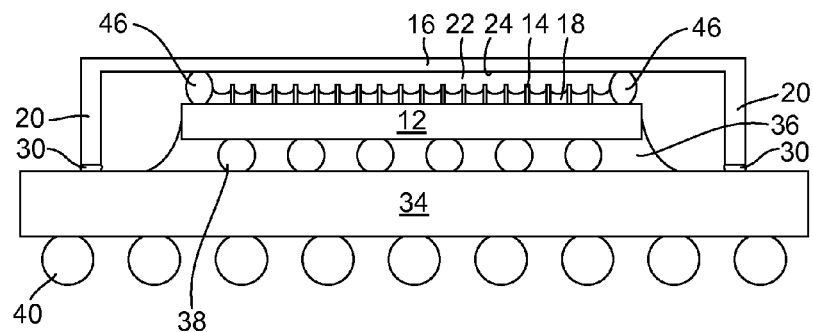
FIG. 6 illustrates an electronic assembly including a heat spreading device on a die that is coupled to a substrate, in accordance with certain embodiments.

FIG. 6 illustrates an assembly in accordance with an embodiment including a vapor chamber structure including carbon nanotube structures 14 and working fluid 18 on die 12. In the embodiment of FIG. 6, the sidewalls 20 of the endcap 16 are coupled to the substrate 34 instead of to the die 12 as in FIG. 5. Barrier structures 46 may be provided on the die 12 to keep the working fluid 18 from flowing off of the die 12. Alternatively, the barrier structures 46 maybe omitted and more working fluid included 18 in the system.

Embodiments including a vapor chamber formed on the die may provide one or more of the following benefits over conventional cooling mechanisms utilizing a thermal interface material and a solid plate-like heat spreader stacked on a die, including: (i) performing heat spreading at the die level; (ii) avoiding the use of conventional thermal interface materials by growing nanotubes on the die, and (iii) increased heat spreading performance using the two phase (liquid/vapor) due to the relatively high value of latent heat of evaporation versus the heat transfer through the conventional thermal interface material and solid plate-like heat spreader.

Figure 7:
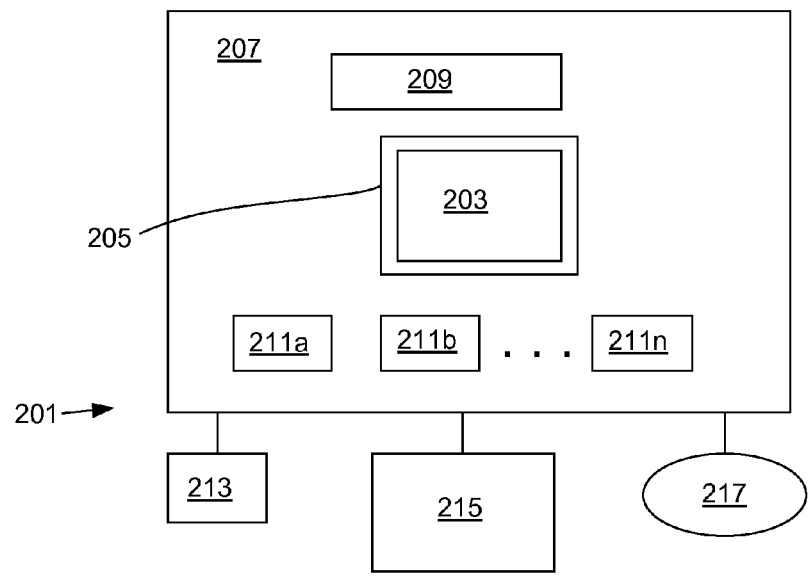
FIG. 7 is an electronic system arrangement in which certain embodiments may find application.

Assemblies including vapor chamber as described above may find application in a variety of electronic components, including, but not limited to, a single core microprocessor, a multiple core microprocessor, a graphics processor, a memory controller, an ASIC, a chipset, and combinations thereof. FIG. 7 schematically illustrates one example of an electronic system environment in which aspects of described embodiments may be embodied. Other embodiments need not include all of the features specified in FIG. 7, and may include alternative features not specified in FIG. 7.

The system 201 of FIG. 7 may include at least one central processing unit (CPU) 203. The CPU 203, also referred to as a microprocessor, may be a die which is attached to an integrated circuit package substrate 205, which is then coupled to a printed circuit board 207, which in this embodiment, may be a motherboard. The CPU 203 (which may be a single core or multi-core processor) on the package substrate 205 is an example of an electronic device assembly that may have a structure formed in accordance with embodiments such as described above. A variety of other system components, including, but not limited to, memory and other components discussed below, may also include assembly structures formed in accordance with the embodiments described above.

The system 201 further may further include memory 209 and one or more controllers 211a, 211b . . . 211n, which are also disposed on the motherboard 207. The motherboard 207 may be a single layer or multi-layered board which has a plurality of conductive lines that provide communication between the circuits in the package 205 and other components mounted to the board 207. Alternatively, one or more of the CPU 203, memory 209 and controllers 211a, 211b . . . 211n may be disposed on other cards such as daughter cards or expansion cards. The CPU 203, memory 209 and controllers 211a, 211b . . . 211n may each be seated in individual sockets or may be connected directly to a printed circuit board. A display 215 may also be included.

Any suitable operating system and various applications execute on the CPU 203 and reside in the memory 209. The content residing in memory 209 may be cached in accordance with known caching techniques. Programs and data in memory 209 may be swapped into storage 213 as part of memory management operations. The system 201 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant) telephony device (wireless or wired), network appliance, virtualization device, storage controller, network controller, router, etc.

The controllers 211a, 211b . . . 211n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 213 in accordance with a storage protocol layer. The storage protocol of the layer may be any of a number of known storage protocols. Data being written to or read from the storage 213 may be cached in accordance with known caching techniques. A network controller can include one or more protocol layers to send and receive network packets to and from remote devices over a network 217. The network 217 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

The foregoing description has been presented for the purposes of illustration and description. It is not intended to be exhaustive or to limit to the precise form disclosed. Many modifications and variations are possible in light of the above teachings.

What is claimed:

1. A method comprising:
   forming a plurality of nanotube structures on a semiconductor die;
   after the forming the plurality of nanotube structures on the semiconductor die, positioning a fluid between at least some of the plurality of nanotube structures on the semiconductor die; and
   positioning an endcap to cover the plurality of nanotube structures, wherein the endcap is positioned to define a gap between the plurality of nanotube structures and an interior surface of the endcap;
   wherein the endcap has a width that is no larger than that of the die, wherein the endcap includes sidewalls, and further comprising coupling the sidewalls to the semiconductor die.

2. The method of claim 1, further comprising forming the plurality of nanotube structures from a material comprising carbon.

3. The method of claim 1, further comprising positioning the endcap so that an interior surface of the endcap is spaced apart from the plurality of nanotube structures a distance in the range of 25-400 microns.

4. The method of claim 1, wherein the fluid is selected from the group consisting of water, alcohols, perfluorocarbons, and hydrofluoroethers.

5. The method of claim 1, wherein the positioning the fluid is carried out after the positioning the endcap, wherein the positioning the fluid includes transmitting the fluid through an opening in the endcap, and wherein the opening is closed after the fluid is delivered.

6. The method of claim 1, wherein the forming the plurality of nanotube structures includes nanotube structures having a width on the order of 10 nm.

7. A method comprising:
   forming a plurality of nanotube structures on a semiconductor substrate using chemical vapor deposition;
   after the forming the plurality of nanotube structures on the semiconductor substrate, positioning an endcap to cover the plurality of nanotube structures;
   positioning a fluid between the plurality of nanotube structures;
   wherein the endcap is configured and positioned so that an interior chamber is at least partially defined between the semiconductor substrate and an interior surface of the endcap, the fluid being positioned within the interior chamber; and
   wherein the endcap includes sidewalls positioned on the semiconductor substrate, wherein a width of the interior chamber is less than that of the semiconductor substrate.

8. The method of claim 7, further comprising forming an insulating layer on the substrate and a catalyst layer on the insulating layer, wherein the plurality of nanotube structures are formed on the catalyst layer.

9. The method of claim 7, wherein the semiconductor substrate is in the form of a semiconductor die.

10. The method of claim 9, wherein the semiconductor substrate is positioned on a support substrate.

11. The method of claim 7, wherein the positioning the fluid is carried out after the positioning the endcap, wherein the positioning the fluid includes transmitting the fluid through an opening in the endcap, and closing the opening after the fluid is transmitted.

12. The method of claim 7, wherein the endcap is configured so that an upper end of each of the plurality of nanotube structures is spaced apart from the endcap.

13. A method comprising:
   providing a semiconductor substrate;
   growing a plurality of nanotube structures on the semiconductor substrate;

coupling an endcap to the semiconductor substrate to form a chamber between the semiconductor substrate and an interior surface of the endcap, the endcap including a width that is no larger than that of the semiconductor substrate, the endcap including sidewalls coupled to the semiconductor substrate; and after the growing the plurality of nanotube structures, positioning a fluid within the chamber.

14. The method of claim 13, further comprising forming an oxide layer on the semiconductor substrate, and forming a catalyst layer on the oxide layer, prior to the growing the plurality of nanotube structures.

\* \* \* \* \*